(12) United States Patent
Greenslade et al.

(10) Patent No.: US 7,238,104 B1
(45) Date of Patent: Jul. 3, 2007

(54) SYSTEM AND METHOD FOR VENTING AIR FROM A COMPUTER CASING

(75) Inventors: Michael D. Greenslade, San Leandro, CA (US); A. Fred Hendrix, Salida, CA (US); Francisco Martinez-Ponce, Modesto, CA (US)

(73) Assignee: Foundry Networks, Inc., Santa Clara, CA (US)

( * ) Notice: Subject to any disclaimer, the term of this patent is extended or adjusted under 35 U.S.C. 154(b) by 0 days.

(21) Appl. No.: 10/429,161

(22) Filed: May 2, 2003

(51) Int. Cl.
*H05K 5/00* (2006.01)

(52) U.S. Cl. ................................ 454/184; 361/695

(58) Field of Classification Search ............ 454/184; 361/695; 137/512.1, 527, 527.6, 527.8; 415/126
See application file for complete search history.

(56) References Cited

U.S. PATENT DOCUMENTS

| | | | |
|---|---|---|---|
| 5,165,770 A | 11/1992 | Hahn | |
| 5,497,873 A | 3/1996 | Hay | |
| 5,559,673 A * | 9/1996 | Gagnon et al. | 361/695 |
| 5,718,628 A | 2/1998 | Nakazato et al. | |
| 5,769,159 A | 6/1998 | Yun | |
| 6,005,770 A | 12/1999 | Schmitt | |
| 6,042,348 A * | 3/2000 | Aakalu et al. | 417/423.5 |
| 6,181,557 B1 * | 1/2001 | Gatti | 361/695 |
| 6,185,098 B1 | 2/2001 | Benavides | |
| 6,229,701 B1 | 5/2001 | Kung et al. | |
| 6,315,656 B1 * | 11/2001 | Pawlowski | 454/184 |
| 6,604,799 B2 | 8/2003 | Searby et al. | |
| 6,616,404 B1 * | 9/2003 | Davis et al. | 415/147 |
| 6,775,137 B2 | 8/2004 | Chu et al. | |
| 6,837,785 B2 * | 1/2005 | Soderlund | 454/184 |
| 6,896,612 B1 * | 5/2005 | Novotny | 454/184 |
| 6,963,488 B1 * | 11/2005 | Chen | 361/687 |
| 7,031,154 B2 * | 4/2006 | Bash et al. | 361/690 |
| 2003/0124971 A1 * | 7/2003 | Williams | 454/184 |
| 2003/0198018 A1 * | 10/2003 | Cipolla et al. | 361/687 |

\* cited by examiner

*Primary Examiner*—Gregory Wilson
(74) *Attorney, Agent, or Firm*—James E. Parsons (57) ABSTRACT

A vent for a computer enclosure is envisioned. The vent system has a fan, operable to draw a flow of air from within the enclosure and direct it out through an outlet vent disposed in a wall of the enclosure. The outlet vent is made of an outlet path. The outlet path is defined by a first and a second side member. The first and second side members are attached to the enclosure and form an environmental seal. The outlet vent also has an outlet face oriented at a first angle relative to the wall. A plurality of slats are rotatably coupled to the outlet face. The plurality of slats maintain a first position when the fan is not operating. When the fan goes into an operational mode and produces an airflow, the plurality of slats swing radially outward to a second position. The plurality of slats return to the first position when the airflow is not present. The angle of the slats in the first position is nearer to parallel to the first angle than when in the second position.

17 Claims, 9 Drawing Sheets

SYSTEM AND METHOD FOR VENTING AIR FROM A COMPUTER CASING

FIELD OF THE INVENTION

The invention is directed towards a venting system for a computer enclosure. More specifically, the invention is directed towards venting system that dynamically allows and/or restricts the outflow path of air for venting system.

BACKGROUND OF THE ART

Many computer systems have venting systems to allow a fan or other environmental mechanism to output heated air to an external environment. Typically, a fan will draw air across electronic components found within the enclosure for the computer system. The heated electronic components transfer heat to the air as an airflow passes across the electronic components. A fan or other environmental outlet mechanism draws the heated air to an aperture or vent disposed in the enclosure. The fan then directs the heated air through the vent into the external environment. All the while, the same outflow produces an inflow of cooler air into the casing, and the process is repeated.

Some systems contain dynamic thermal regulation systems. When a sensor detects increased thermal parameters in the internal environment of the enclosure, the operational speed of the fan may be increased. Conversely, when a sensor detects decreased thermal parameters in the internal environment of the enclosure, the operational speed of the fan may be decreased.

In many systems, the vent is a grated structure disposed across the aperture in the wall of the enclosure. During periods with an increased outflow, the heated air may be obstructed by such a fixed structure. The totality of the heated air may not be able to be expelled through the vent, leading to inefficient heat transfer in the case.

In these same systems, the periods of low flow may also lead to decreased heat transfer. This might occur, as the pressure of the outflow does not completely block the now-expelled heated air from reentering the enclosure. Again, this may lead to inefficient heat transfer in the case.

BRIEF DESCRIPTION OF INVENTION

A vent for a computer enclosure is envisioned. The vent system has a fan, operable to draw a flow of air from within the enclosure and direct it out through an outlet vent disposed in a wall of the enclosure. The outlet vent is made of an outlet path. The outlet path is defined by a first and a second side member. The first and second side members are attached to the enclosure and form an environmental seal. The outlet vent also has an outlet face oriented at a first angle relative to the wall. A plurality of slats are rotatably coupled to the outlet face. The plurality of slats maintain a first position when the fan is not operating. When the fan goes into an operational mode and produces an airflow, the plurality of slats swing radially outward to a second position. The plurality of slats return to the first position when the airflow is not present. The angle of the slats in the first position is nearer to parallel to the first angle than when in the second position.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of a system and method for venting air from a computer casing are described herein in the context of an enclosure for the storage and operation of electronic components having increased airflow characteristics. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another. Moreover, it will be appreciated that such a development effort might be complex and time-consuming, but would nevertheless be a routine undertaking of engineering for those of ordinary skill in the art having the benefit of this disclosure. In accordance with the present invention, the components or structures may be implemented using various types of items.

Figure 1:
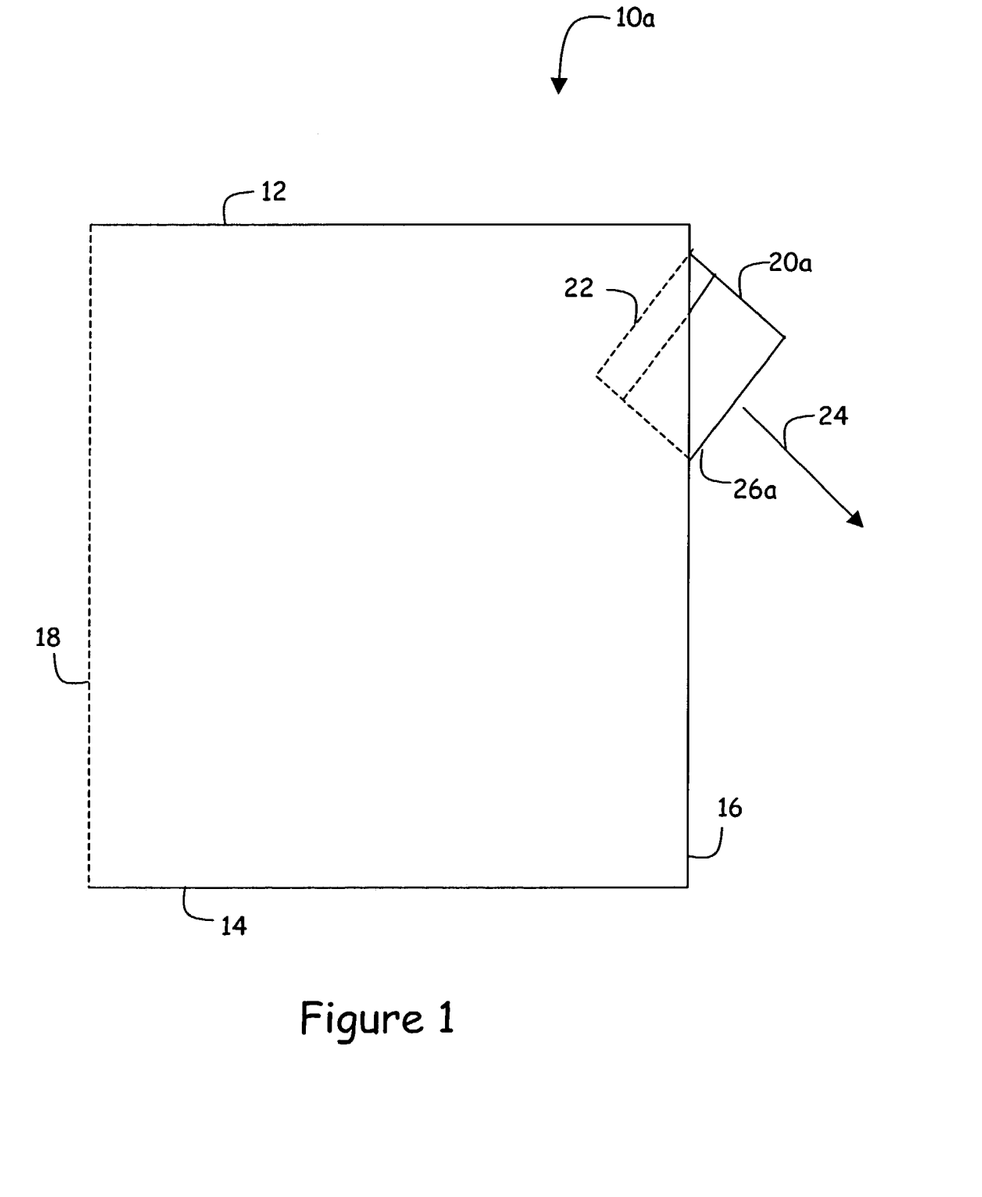
FIG. 1 is a cross-sectional diagram of a computer enclosure and a venting system for such in enclosure, in accordance with the invention.

FIG. 1 is a cross-sectional diagram of a computer enclosure and a venting system for such an enclosure, in accordance with the invention. A computer enclosure 10a has a housing defined by an upper wall 12 and a bottom wall 14.

The upper wall 12 and the bottom wall 14 are attached to a rear wall 16. Also present, but not shown, the upper wall 12, the bottom wall 14, and the rear wall 16 are attached to two side walls. In some enclosures, a front wall 18 is present. However, in some "rack mount" computer units, the front wall 18 may not be present. Electronic components are disposed within the housing defined by the two side walls, the upper wall 12, the bottom wall 14, the rear wall 16, and the optional front wall 18. Within the housing, the electronic components are protected from damage from the external environment.

The two side walls, the upper wall 12, the bottom wall 14, the rear wall 16, and the optional front wall 18 all impede the flow of air from the environment external to the housing into the housing, thus contributing to heat buildup in the housing. To alleviate the thermal problems associated with the housing, intake openings are disposed in the walls. These openings, acting in coordination with a vent and with an environmental flow mechanism, such as a fan, provide a flow of cooler air from the external environment through the enclosure 10a and across the electronic components contained therein.

Disposed on the rear wall 16 is a vent 20a. In practice, a fan, or other environmental flow mechanism, is used to direct an airflow through the enclosure 10a of the computer system. This airflow is expelled from the enclosure 10a through the vent 20a. A fan 22 directionally vents the airflow at an angle away from perpendicular to the rear wall 16.

In the embodiment depicted in FIG. 1, the outlet airflow is depicted by an arrow 24. The outflow 24 is vented through a face 26a of the vent 20a. In this manner, the outflow 24 is directed downwards and outwards from the enclosure 10a for the computer system.

Figure 2:
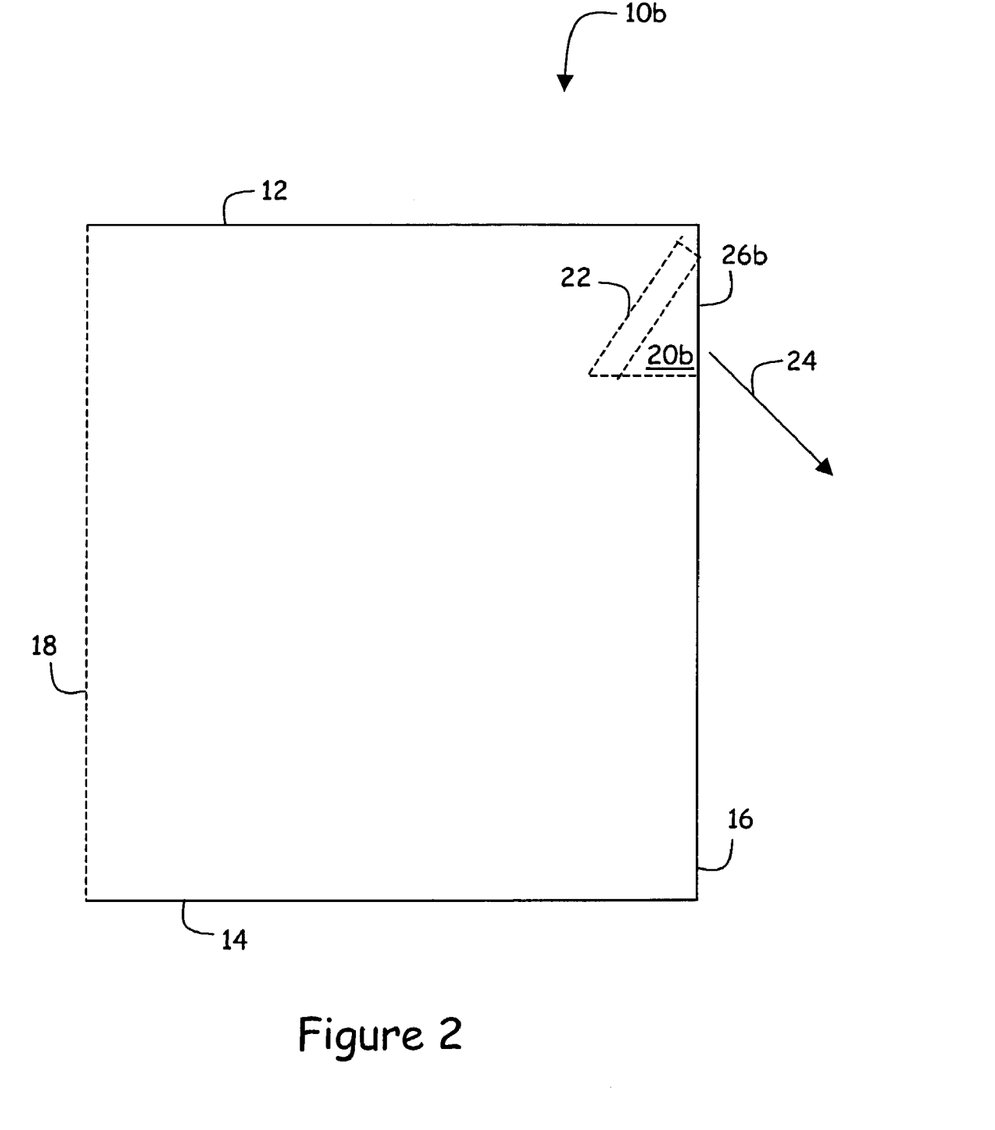
FIG. 2 is a cross-sectional diagram of another embodiment of the computer enclosure and a venting system for such an enclosure, in accordance with the invention.

FIG. 2 is a cross-sectional diagram of another embodiment of the computer enclosure and a venting system for such an enclosure, in accordance with the invention. The same structural features of the vent are present, but embedded within the construction of the enclosure 10b. In the embodiment depicted in FIG. 2, an arrow 24 again depicts the outlet airflow from the enclosure 10b. The outflow 24 is vented through a vented face 26b of the vent 20b. Again, the outflow 24 is directed downwards and outwards from the enclosure 10b for the computer system. It should be noted that the structures depicted in all the Figures may be interior to the enclosures, exterior to the enclosures, or partially interior and partially exterior in nature.

Typically, the environmental flow mechanism 22 may be a fan. However, other flow mechanisms are known to those skilled in the art, and this disclosure should be read as to include them as well. Such art may include such mechanisms as pumps, blowers, or any mechanism operable to produce an environmental flow from within the enclosure to the exterior environment. Further, the vent assembly and fan may be placed on any exterior wall, and the inclusion of them on the rear wall should be for illustrative purposes. Additionally, only one fan and vent assemblies are shown in FIG. 1 and in FIG. 2. It should be noted that any number of these fans and/or vents may be contemplated in the scope of this disclosure, as well as the placement of the fans and/or vents on or about differing walls.

Figure 3:
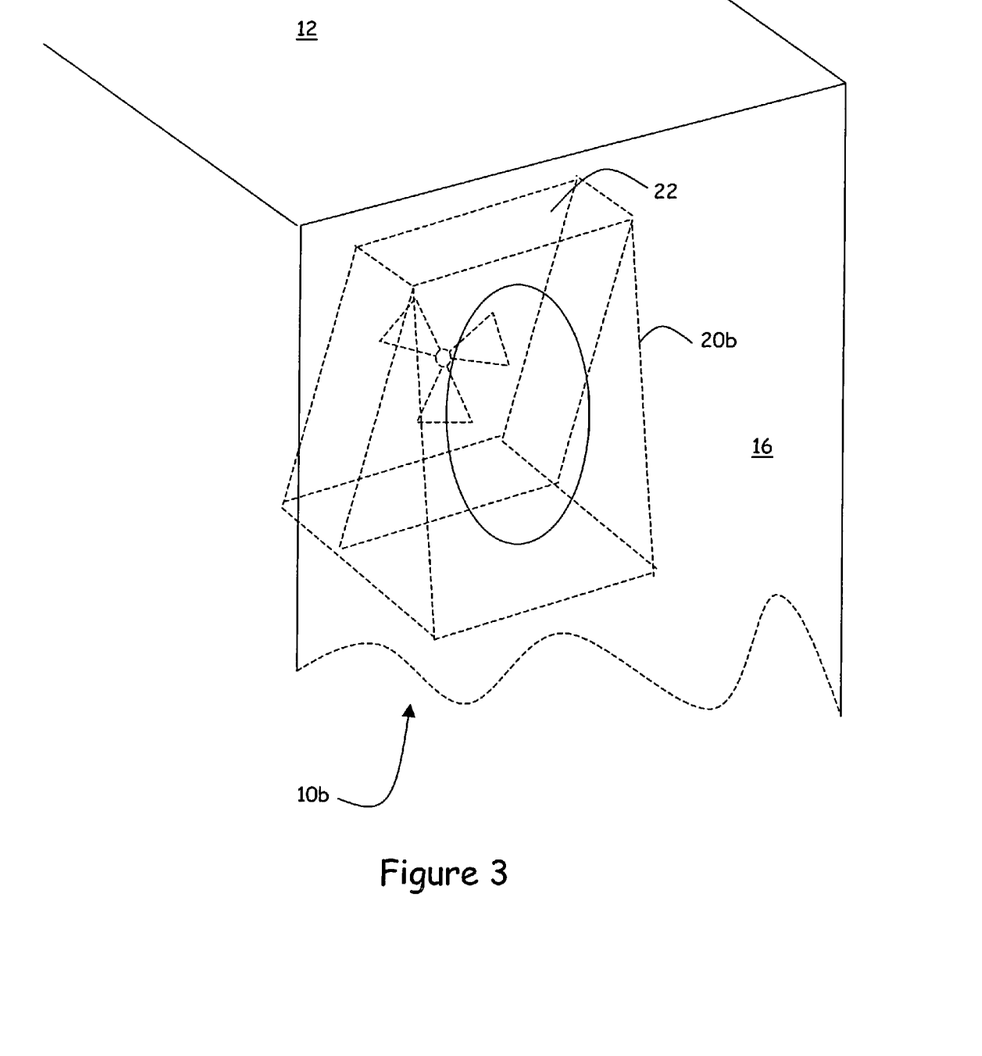
FIG. 3 is a perspective diagram detailing an embodiment of the fan and vent assembly of FIG. 2 in accordance with the invention.

FIG. 3 is a perspective diagram detailing an embodiment of the fan and vent assembly of FIG. 2 in accordance with the invention. This diagram illustrates and highlights the relationship of the directional nature of the fan 22 with respect to the back wall 16. This diagram is provided without showing any structures covering the face of the vent 20b, as that relationship is diagrammed and explained in succeeding portions of this disclosure.

Figure 4:
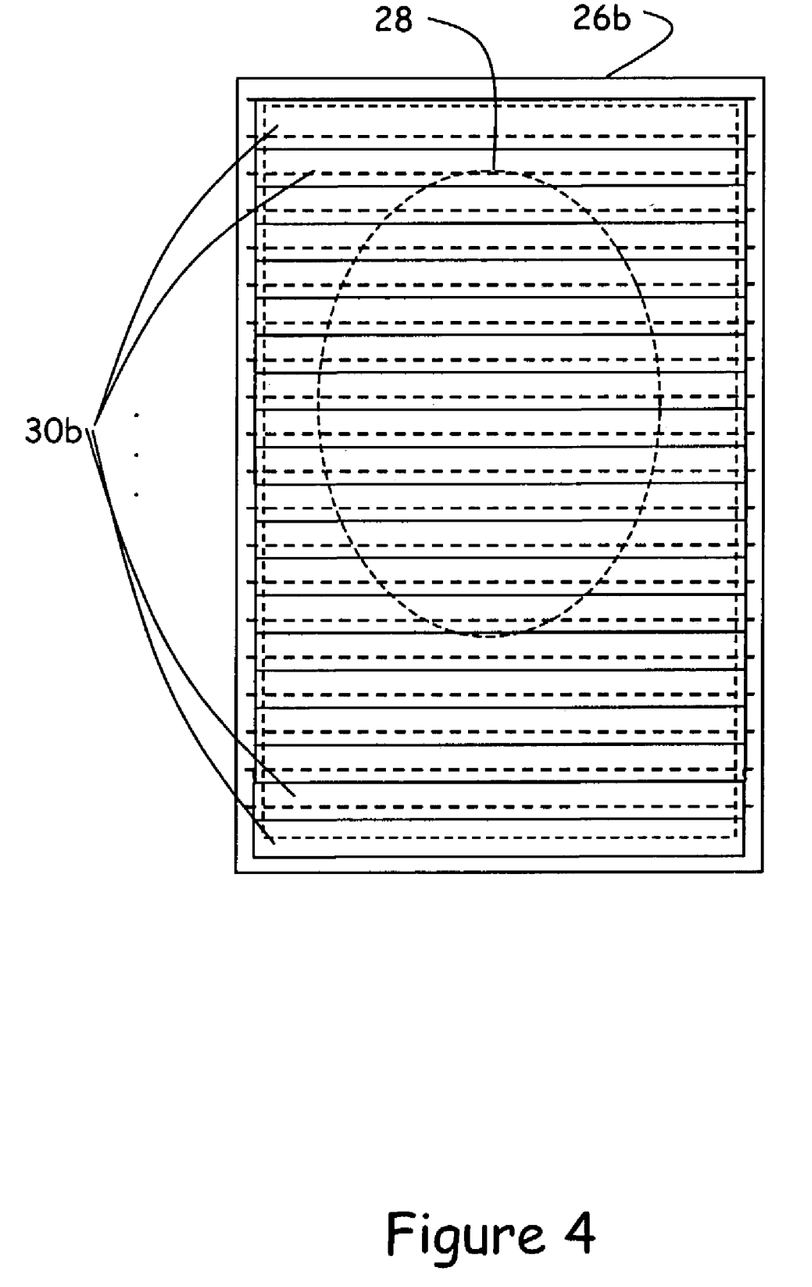
FIG. 4 is a perspective diagram of the back of the vent assembly during rest and used in conjunction with the enclosure of FIG. 2, in accordance with the invention.

FIG. 4 is a perspective diagram of the back of the vent assembly during rest and used in conjunction with the enclosure of FIG. 2, in accordance with the invention. Covering the face 26b of FIGS. 2 and 3 are slat structures 30b. The slats 30b are made of roughly rectangular structures that fit over the opening disposed in the wall of the enclosure. The rectangular portions block or impede a flow of air into or out of the enclosure 10b. The rectangular portions of the slats 30b rest in a first position in a steady state with no force being applied on them.

The slats 30b are attached to the vent face 26b. The slats 30b are attached in a rotatable manner, allowing the slats 30b to rotate away from the rear wall 16 when a force is applied from the direction of the interior of the enclosure 10b. Thus, when such a force is applied, the rectangular portions of the slats 30b rotate to a second position that is more perpendicular to the plane of the rear wall 16 than as when the force is not present. When such a force is removed, the slats 30b rotate back to their rest position, with the rectangular portions of the slats 30b returning to the first position, that being at an angle more parallel to the rear wall 16 than the second position.

When the fan is engaged, an output flow of air is directed from the interior of the enclosure 10b through an environmental opening 28. The combination of the action of the fan and the vent 20b direct the airflow downwards and across the face of the slats 30b. As such, the resulting outflow creates a force against the hanging slats 30b, causing them to lift upwards and outwards in a radial manner.

With increased outflows from the interior of the enclosure 10b through the environmental opening 28, the force directed on the slats 30b correspondingly increases. This increased force results in the slats 30b lifting higher and more outward than they would be under a decreased flow. As the outflow increases, the slats 30b move out of the way and create less of an impediment to the outflow of air. Accordingly, increased outflows do not result in a "backwash" effect, wherein the outflow is forced back into the enclosure.

With decreased outflows, the slats 30b lower. The lower position of the rectangular portions of the slats 30b decrease the area available for expelled air to reenter the enclosure 10b after it has been expelled. Accordingly, decreased outflows do not result in a "reentry" effect, wherein the outflow can reenter the enclosure 10b under a decreased outflow.

It should be noted that the assembly of FIGS. 2 and 3 direct the airflow in a downwards direction. One skilled in the art will recognize that a differing orientation of outflow may be obtained in the upwards direction with little experimentation, and this disclosure should be read as including the upwards orientation herein.

Figure 5:
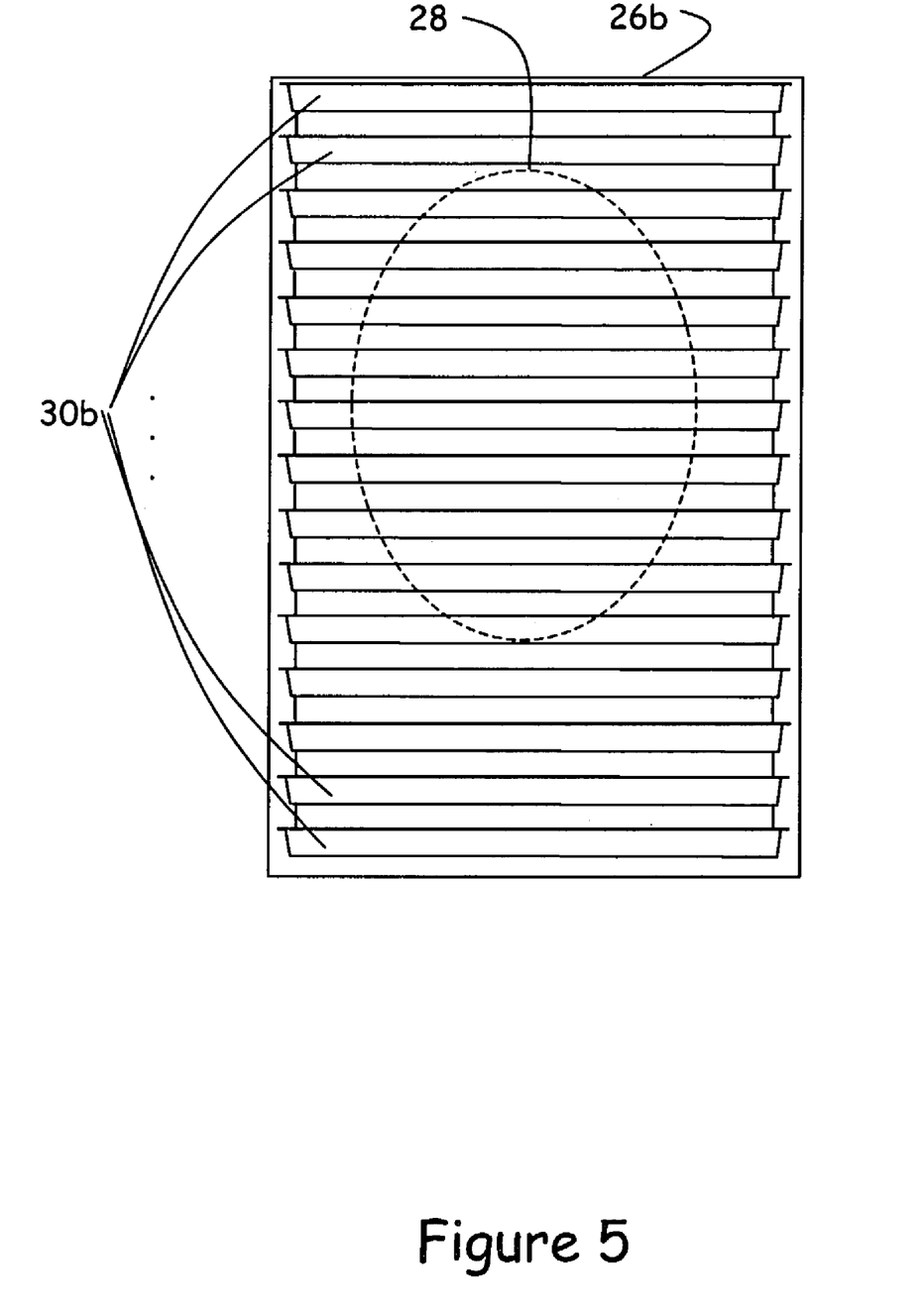
FIG. 5 is a perspective diagram of the back of the vent assembly during a time that the fan is operating and used in conjunction with the enclosure of FIG. 2, in accordance with the invention.

FIG. 5 is a perspective diagram of the back of the vent during a time that the fan is operating and used in conjunction with the enclosure of FIG. 2, in accordance with the invention. The airflow produced by the fan is, in this case, directed downwards. The airflow impinges on the rectangular portion of the slats 30b. The resulting force lifts them away from the rear wall 16, as depicted in FIG. 5.

Figure 6:
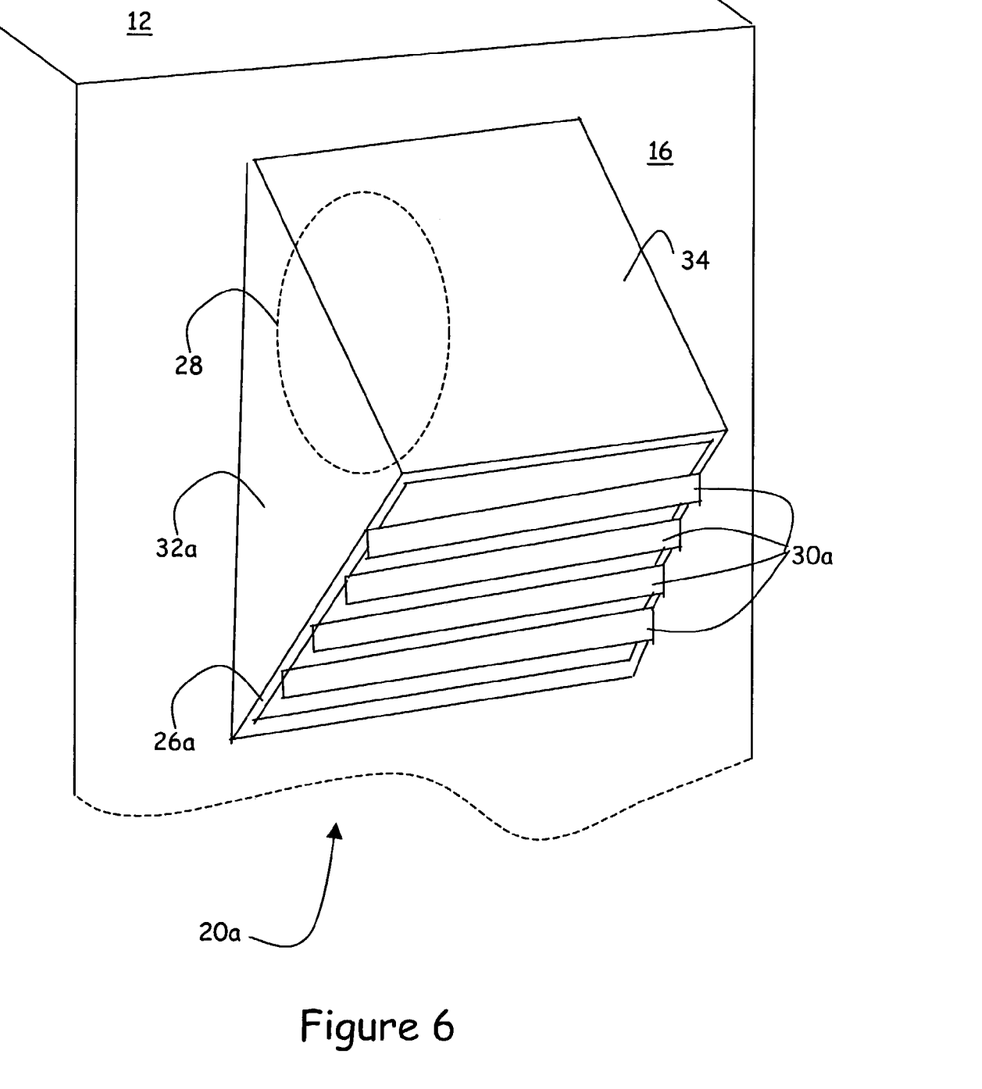
FIG. 6 is a perspective view of the vent as depicted in FIG. 1, in accordance with the invention.

FIG. 6 is a perspective view of the vent as depicted in FIG. 1, in accordance with the invention. The vent 20a has a first support member 32a which is attached to the enclosure 10a for the computing system. Not shown, a corresponding second support member is located opposite the first support member 32a. The first support member 32a and the second support member (not shown), together with a structural member 34 form an outlet path for the venting of air out of the enclosure 10a for the computer system.

Shown in dashed lines, the vent 28 or other environmental opening is disposed in the rear wall 16 of the enclosure 10a for the computer system. From the fan, an airflow from the interior of the enclosure 10a for computer system is directed out of the environmental opening 28. The airflow emanating from the environmental opening 28 is redirected by the solid support member 32a, the second support member (not shown), and the structural member 34 in a specified direction. In this case, the three members form an outlet path directed downwards. Of course, the members 32a and 34 need not end at the rear wall 16. They may continue into the interior of the enclosure 10a for the computer system, as denoted in FIG. 1, in part or in whole.

The bottom edge 26a of the outlet vent assembly 20a has a plurality of slats 30a coupled to it. Again, the slats 30a are rotatably coupled, allowing the slats 30a to swing outwards upwards in response to any airflow emanating from the enclosure 10a for the computer system.

When the fan is engaged, an output flow of air is directed from the environmental opening 28. The combination of the structural member 34, the support member 32a, and the other support member (not shown) direct the airflow downwards and across the face of the slats 30a. As such, the resulting outflow creates a force against the hanging slats 30a. This force causes the slats 30a to lift upwards and outwards in a radial manner.

Like that described above, with increased outflows from the environmental opening 28, the force directed on the slats 30a correspondingly increases. This increased force from the outflow results in the slats 30a lifting higher and more outward than they would be under a decreased flow. As the outflow increases, the slats 30a move out of the way and create less of an impediment to the outflow of air. Accordingly, increased outflows do not result in a "backwash" effect, wherein the outflow is forced back into the enclosure 10a of the computer system.

Again, with decreased outflows, the slats 30a lower and decrease the area available for expelled air to reenter. Accordingly, decreased outflows do not result in a "reentry" effect, wherein the outflow can reenter the enclosure 10a of the computer system under a decreased outflow.

The bottom face 26a of the outlet vent is disposed at an angle relative to the wall of the enclosure 10a to which it is disposed on. The slats 30a coupled to the bottom face 26a assume a rest position when the fan is not operating. In the rest position, the rectangular portion of the slats 30 are oriented in an approximately vertical manner due to gravity.

As described above, during operation of the fan, the slats 30a swing outwards from the vent face 26a to assume a second position. The rectangular portions of the slats 30a are oriented during operation of the fan at an angle nearer the perpendicular to the vent face 26a than they assume during the rest position. Accordingly, the orientation of the slats 30a move between being in the rest position and that of full operation based upon the level of flows emanating from the environmental opening 28.

In an alternative embodiment, the vent face 26a to which the slats 30a are attached may be directed upwards. In this case, the air flow emanating out of the enclosure 10a for the computer system is directed upwards, instead of downwards.

Figure 7:
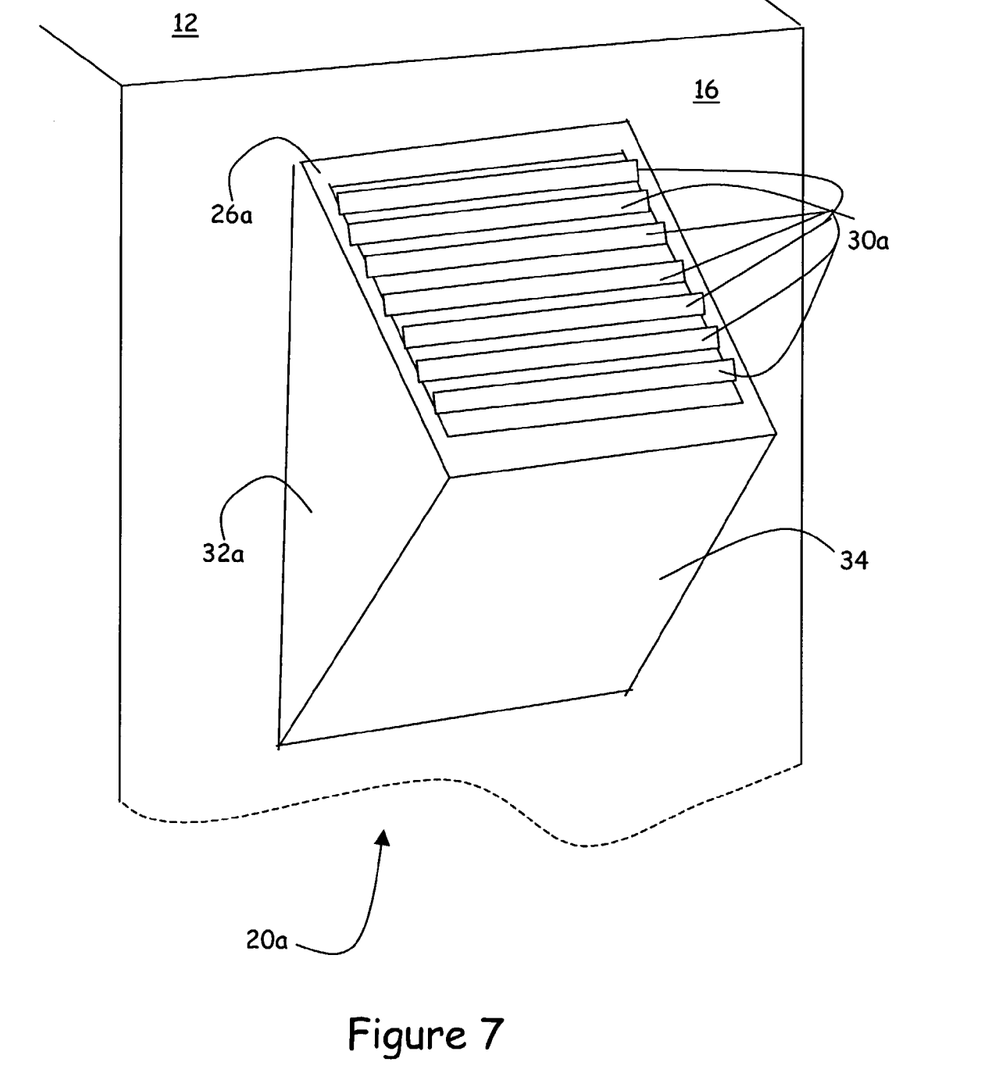
FIG. 7 is a perspective view of an alternative orientation of the vent of FIG. 1, in accordance with the invention.

FIG. 7 is a perspective view of an alternative orientation of the vent of FIG. 1, in accordance with the invention. Many of the same features of the embodiment of FIG. 6 are present, with the airflow being directed upwards instead of downwards. In this embodiment, the support member 32a and the other support (not shown) are substantially the same as that depicted in FIG. 2. In FIG. 7, the structural member 34 is located on the downward face of the venting structure. The slats 30a are arranged on the upper face of the venting structure, allowing an upwards flow of air out of the enclosure 10a of the computer system.

In the embodiment depicted in FIG. 7, the rest position of the slats 30a is at an angle substantially parallel to the angle that the upper face 26a is in relation to the rear wall 16 of the enclosure 10a for the computer system. In this case, the slats 30a lay substantially flat. In one embodiment, they may lie one on top of another. Accordingly, the rest position of the slats 30a in the embodiment of FIG. 7 strongly inhibits passage of an external environment through the slats 30a and into the enclosure 10a of the computer system.

Again, during times when the fan is operating, the outflows from the environmental opening 28 impinge against the surface of the slats 30a, causing them to raise upwards and allowing an escape path for the outgoing air flows. During the time that the fan is operating, the position in which the slats 30a enjoy is dictated by the amount of outcoming airflow from the enclosure 10a of the computer system. Typically during fan operation, the slats 30a will be at an angle closer to the perpendicular to the upper face than when at the rest position.

Figure 8A:
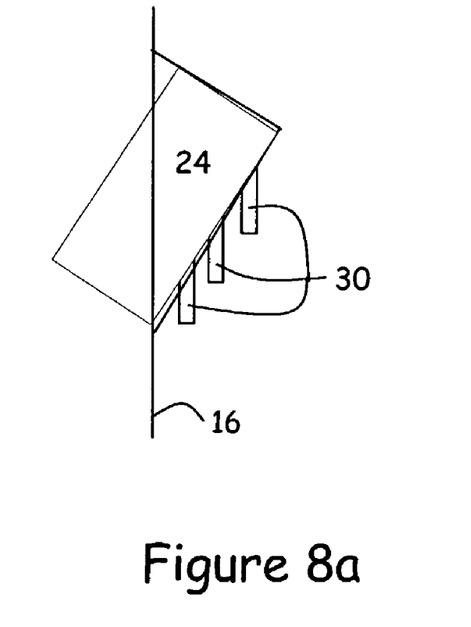
FIGS. 8a and 8b are side views of the vent apparatus of FIG. 6 during rest and during operation of the fan, respectively, in accordance with the invention.
Figure 8B:
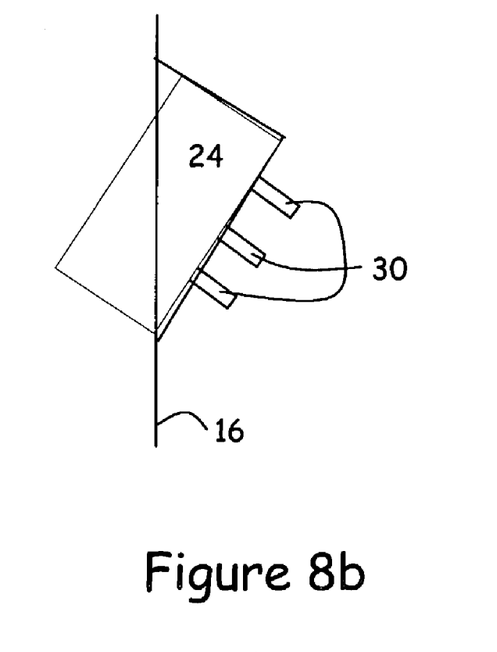

FIGS. 8a and 8b are side views of the vent apparatus of FIG. 6 during rest and during operation of the fan, respectively, in accordance with the invention. In both FIG. 8a, the environmental opening (not shown in FIGS. 8a and 8b) is disposed through the rear wall 16.

During periods of time characterized by no airflow from the interior of the enclosure, such as that depicted in FIG. 8a, the slats 30a are disposed at an angle relative to that of the bottom edge of the support number 24a. In this case, the slats 30a hang freely with the force of gravity. It should be noted however that the angle at which the slats 30a rest relative to the support member 32a may be altered through the use of springs or mechanical devices.

FIG. 8b is the side view of the same vent of FIG. 8a during a period of operation. During operation, airflow from the interior of the enclosure is expelled through the environmental opening disposed in the back wall 16. This airflow impinges upon the slats 30a. The force created by the outflow rotatably moves the slats 30a into a second position, as shown in FIG. 8b.

Figure 9A:
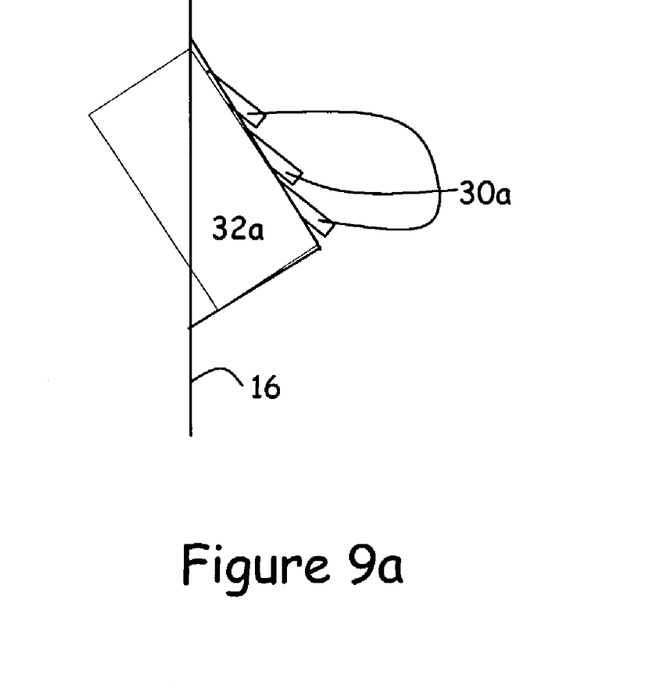
FIGS. 9a and 9b are side views of the vent system of FIG. 7 during rest and during operation of the fan, respectively, in accordance with the invention.
Figure 9B:
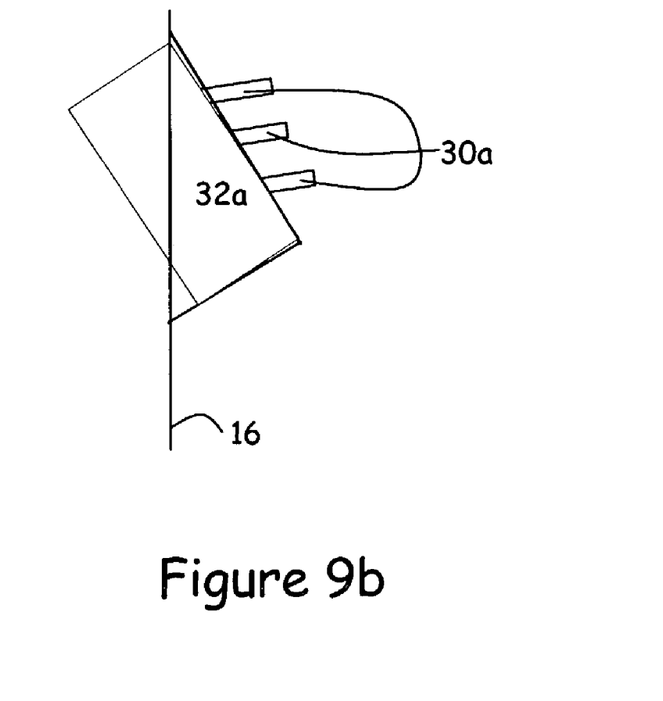

FIGS. 9a and 9b are side views of the vent system of FIG. 7 during rest and during operation of the fan, respectively, in accordance with the invention. In FIG. 9a, the fan or other flow mechanism is not operating. No airflow is directed from the interior of the enclosure through the environmental opening disposed in the wall. Accordingly, the slats 30a assume a position substantially equal to the edge of the vent structure. However, in FIG. 9b, the fan or flow mechanism is operational and producing an airflow from the interior of the enclosure out through the environmental opening. The force of the airflow directed through environmental opening impinges upon the slats 30a. The force of the outflow on the slats 30a tends to move them in a rotational manner as depicted in FIG. 9b.

It should be noted that the slats 30 are depicted with faces having a rectangular construction. Other shapes of faces are known in the art, and should be considered as part of this disclosure.

Thus, a system and method for venting air from a computer casing is described and illustrated. Those skilled in the art will recognize that many modifications and variations of the present invention are possible without departing from the invention. Of course, the various features depicted in each of the figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

Accordingly, what is claimed is:

1. A vent for an enclosure containing electronic equipment, the vent comprising:
    a fan, operable to draw a flow of air from within the enclosure and direct it non-perpendicularly relative to a wall of the enclosure out through an outlet vent structure disposed about the wall;
    said outlet vent structure comprising:
        an outlet path defined by a first and second side member, attached to the enclosure, and an outlet face, said outlet face oriented at a first angle relative to the wall;
        a plurality of slats, rotatably coupled to said outlet face;
        said plurality of slats being in a first position when said fan is not operational;
        said plurality of slats operable to swing radially to a second position when said fan produces an airflow in said outlet vent, wherein the airflow causes said plurality of slats to swing radially from the first position to the second position;
        said plurality of slats returning due to gravity to the first position from the second position when the airflow is not present;
        said plurality of slats in said first position being nearer to parallel to said outlet face than when in said second position.

2. The vent of claim 1 wherein the wall is vertical and the first angle is primarily downwards.

3. The vent of claim 1 wherein the wall is vertical and the first angle is primarily upwards.

4. The vent of claim 1 wherein the outlet vent structure is disposed on the exterior of the wall.

5. The vent of claim 1 wherein the outlet vent structure is disposed at least in part in the interior of the enclosure.

6. The vent of claim 1 wherein the outlet vent structure is disposed within the enclosure.

7. An enclosure for containing electronic modules, the enclosure comprising:
    a housing comprising:
        a plurality of walls, including an upper, a lower, a rear wall, and a plurality of side walls;
        a fan, operable to draw a flow of air from within the housing and direct it non-perpendicularly relative to one of the plurality of walls out through an outlet vent structure disposed about the one of the plurality of walls;
    said outlet vent comprising:
        an outlet path defined by a first and second side member, attached to said one of said plurality of walls;
        an outlet face, attached to said side members, said outlet face oriented at a first angle non-perpendicular to the wall;
        a plurality of slats, rotatably coupled to said outlet face;
        said plurality of slats being in a first position when said fan is not operational;
        said plurality of slats operable to swing radially to a second position when said fan produces an airflow in said outlet vent, wherein the airflow causes said plurality of slats to swing radially from the first position to the second position;
        said plurality of slats returning due to gravity to the first position from the second position when the airflow is not present;
        said plurality of slats in said first position being nearer to parallel to said outlet face than when in said second position.

8. The enclosure of claim 7 wherein the wall is vertical and the first angle is directed downwards.

9. The enclosure of claim 7 wherein the wall is vertical and the first angle is directed upwards.

10. The enclosure of claim 7 wherein said outlet vent is disposed on the exterior of the wall.

11. The enclosure of claim 7 wherein said outlet vent is disposed at least in part in the interior of the housing.

12. The enclosure of claim 7 wherein said outlet vent is disposed within the housing.

13. A vent for a computer enclosure, the vent comprising:
    a fan, disposed within an enclosure, operable to draw a flow of air from within the enclosure and direct it out through an outlet vent disposed about a wall of the enclosure;
    said outlet vent comprising:
        an outlet path defined by a first and second side member, attached to the enclosure, and an outlet face, said outlet face oriented roughly parallel to the wall;
        a plurality of slats, rotatably coupled to said outlet face;
        said plurality of slats being in a first position substantially parallel to the wall when said fan is not operational;
        said plurality of slats operable to swing radially outward to a second position when said fan produces an airflow in said outlet vent;
        said plurality of slats returning to said first position when the airflow is not present; and
        said plurality of slats in said first position being nearer to parallel to said the wall than when in said second position;
    wherein said fan directs the flow of air in a downward direction relative to the wall of the enclosure.

14. A method for venting from a wall of a computer enclosure, the method comprising:
    creating an airflow, from within the enclosure, to a vent disposed about a wall of the enclosure;

outputting the airflow through the vent, at a first direction non-perpendicularly relative to the wall, to an external environment;

impinging the airflow through the vent with a slat coupled in a rotatable manner, wherein said slat is in a first position when said creating an airflow is not present;

swinging said slat radially to a second position from the first position during said creating an airflow, said swinging caused by the airflow; and returning said slat from the second position to the first position when said step of creating ceases, said returning due to gravity.

15. The method of claim 14 said first direction is primarily downward.

16. The method of claim 14 wherein said first direction is primarily upward.

17. An enclosure for operating electronic components, the enclosure comprising:

means for creating an airflow, from within the enclosure, out a vent disposed about a wall of the enclosure, the airflow being in a direction non-perpendicular relative to the wall;

means for impinging the airflow through the vent, said means for impinging being in a first position when said means for creating an airflow is not operating;

means for swinging said means for impinging radially from the first position to a second position during operation of said means for creating an airflow, said airflow causing said means for impinging to swing radially to the second position, and gravity causing the means for impinging to return to the first position when said means for creating an airflow is not operating.

* * * * *